United States Patent [19]

Vora et al.

[11] Patent Number: 4,908,679
[45] Date of Patent: Mar. 13, 1990

[54] LOW RESISTANCE SCHOTTKY DIODE ON POLYSILICON/METAL-SILICIDE

[75] Inventors: Madhukar B. Vora, Los Gatos; Hemraj K. Hingarh, San Jose, both of Calif.

[73] Assignee: National Semiconductor Corporation, Santa Clara, Calif.

[21] Appl. No.: 570,408

[22] Filed: Jan. 12, 1984

Related U.S. Application Data

[63] Continuation of Ser. No. 227,837, Jan. 23, 1981, abandoned.

[51] Int. Cl.⁴ ............................................. H01L 29/48
[52] U.S. Cl. ...................................... 357/15; 357/59; 357/67
[58] Field of Search ...................... 357/15, 59, 67, 71, 357/23.7

[56] References Cited

U.S. PATENT DOCUMENTS

| | | | |
|---|---|---|---|
| 4,070,654 | 1/1978 | Tachi | 357/45 |
| 4,128,670 | 12/1978 | Gaensslen | 357/67 |
| 4,163,246 | 7/1979 | Aomura et al. | 357/59 |
| 4,220,961 | 9/1980 | Werner | 357/15 |
| 4,227,944 | 10/1980 | Brown et al. | 357/67 |
| 4,309,224 | 1/1982 | Shibata | 357/59 |
| 4,392,150 | 7/1983 | Courreges | 357/67.5 |

OTHER PUBLICATIONS

R. Shah et al., "P-N Jcn. & Schot. B. D. Fab. in Laser Recrt. Polyon SiO₂," IEEE Electron Dev. Lett., vol. EDL-2, No. 7, Jul. 1981, pp. 159–161.
A. Tasch et al., "Sil-On-Ins MOSFETS . . . SiO₂" Electronics Letters, Jul. 5, 1979, vol. 15, No. 14, pp. 435–437.

Primary Examiner—Joseph E. Clawson, Jr.
Attorney, Agent, or Firm—Lee Patch; Robert C. Colwell

[57] ABSTRACT

A Schottky diode is fabricated according to the following steps: forming a layer of metal-silicide on an underlying dielectric layer, forming a polysilicon layer on the upper surface of the metal-silicide layer, forming a second dielectric layer on the upper surface of the polysilicon layer and patterning the second dielectric layer to create a contact window through the second dielectric layer to an exposed surface region of the polysilicon layer, and forming a metal contact to the exposed surface region.

3 Claims, 2 Drawing Sheets

LOW RESISTANCE SCHOTTKY DIODE ON POLYSILICON/METAL-SILICIDE

This is a continuation of application Ser. No. 227,837, filed Jan. 23, 1981 now abandoned.

BACKGROUND OF THE INVENTION

1. Field of the Invention

The present invention is directed to Schottky diodes and more particularly to a polysilicon Schottky diode which is fabricated by forming a sandwich of metal-silicide, polysilicon and metal on silicon dioxide.

2. Brief Description of Prior Art

Schottky diodes are commonly fabricated in single crystal silicon together with bipolar transistors. In such devices, an N+buried layer is used as the diode cathode. This causes both diode series resistance and buried layer to substrate capacitance to be very high.

Schottky diodes have also been fabricated on polysilicon. However, two problems associated with this practice have been observed. First, Schottky diodes on polysilicon produce excessive leakage and low breakdown voltages. Second, such structures typically have high diode lateral series resistance due to the low mobility of electrons in polysilicon.

A SUMMARY OF THE INVENTION

The present invention provides a method for fabricating a polysilicon Schottky diode structure which comprises a sandwich of metal-silicide, polysilicon and metal on silicon dioxide. The Schottky diode is fabricated by forming a layer of metal-silicide on an underlying dielectric layer, forming a polysilicon layer on the upper surface of the metal-silicide layer, forming a second dielectric layer on the upper surface of the polysilicon layer and patterning the second dielectric layer to create a contact window through the second dielectric layer to an exposed surface region of the polysilicon layer, and forming a metal contact to the exposed surface region.

In fabricating an integrated Schottky diode structure according to a preferred method of the present invention, a metal-silicide layer is deposited on an underlying layer of silicon dioxide. A polysilicon layer is then deposited on the upper surface of the metal-silicide layer. Phosphorous is then implanted into the polysilicon layer to provide a lower N+polysilicon layer which forms an ohmic interface with the metal-silicide layer and a surface layer comprising N- polysilicon. The structure is then laser annealed such that about the top 3000 Angstroms of the polysilicon layer become single crystal. The polysilicon layer is then oxidized to form an overlying layer of silicon dioxide. The silicon dioxide is then masked and etched to create contact windows to exposed selected underlying surface regions of the polysilicon layer. N+impurities are then implanted near the surface of the polysilicon at one selected contact window to form an N+region which serves as a metal-silicide pick-up. Finally, metal contacts are formed at the contact windows to create Schottky barrier anodes and a contact to the metal-silicide pickup.

As stated above, the Schottky barrier diode of the present invention provides several advantages over prior art structures. First, it substantially eliminates capacitance problems. Second, by laser annealing the polysilicon surface, the polysilicon is converted to single crystal which inhibits leakage and improves breakdwon voltages. Third, by utilizing the metal-silicide as a common cathode, lateral series resistance of the diode is reduced significantly.

DESCRIPTION OF A PREFERRED EMBODIMENT

Figure 1:
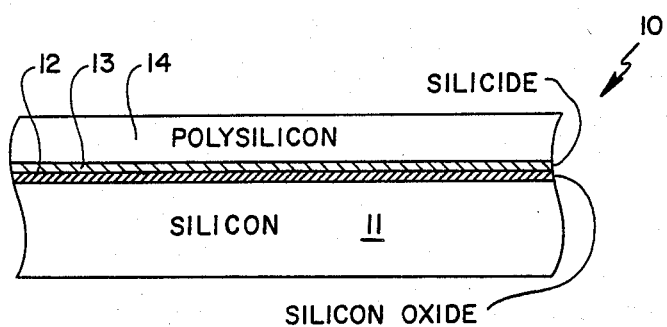
FIG. 1 is a cross-sectional view of a semiconductor wafer following deposition of a layer of polycrystalline silicon.

FIG. 1 shows a semiconductor wafer 10 which comprises a silicon dioxide layer 12 formed on the upper surface of an underlying silicon substrate 11. A layer of metal-silicide 13, preferably tantalum-silicide, preferably about 1500 Angstroms thick, is deposited upon the upper surface of the silicon dioxide layer 12 by either chemical vapor deposition or evaporation. A polysilicon layer 14, preferably about 5000 Angstroms thick, is deposited on the upper surface of the metal-silicide layer 13 by chemical vapor deposition.

Figure 2:
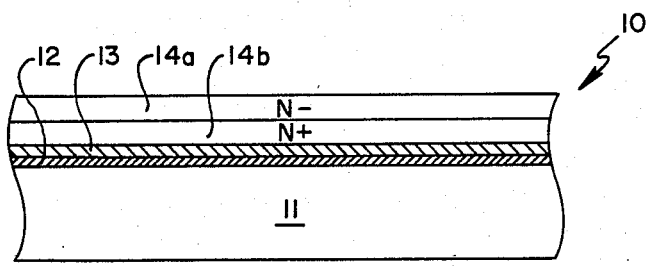
FIG. 2 is a cross-sectional view of a semiconductor wafer at a later stage in the process following doping of the layer of polycrystalline silicon.
Figure 2A:
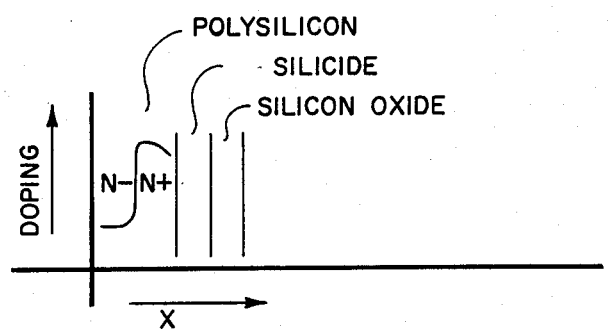
FIG. 2a illustrates the doping profile of the polycrystalline silicon layer.

As shown in FIG. 2, N-type impurities, typically phosphorous, are implanted in the polysilicon layer 14 to provide a lower N+polysilicon layer 14b which forms an ohmic interface with the metal-silicide layer 13 and a surface layer 14a comprising N- polysilicon. A doping profile of the polysilicon layer 14 is shown in FIG. 2a.

The upper surface of the wafer 10 is then laser annealed such that about the top 3000 Angstroms of the polysilicon layer 14 become single crystal. This is done to inhibit leakage between the metal anodes described below and the polysilicon layer. Then, using a photoresist mask (not shown), isolated islands of polysilicon/silicide are defined and oxidized to protect the sidewalls and the tops of the islands.

Figure 3:
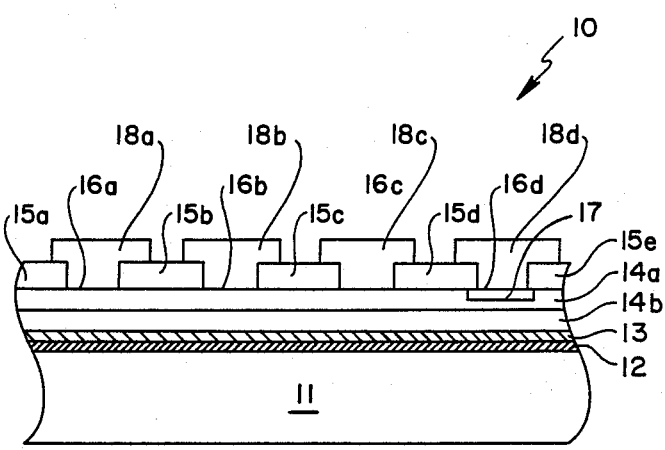
FIG. 3 is a cross-sectional view of the wafer following formation of contacts.

As shown in FIG. 3, the silicon dioxide layer which remains overlying the island is then masked and etched according to conventional photolithographic techniques to form regions 15a, 15b, 15c, 15d and 15e which define contact windows to exposed selected surface regions 16a, 16b, 16c and 16d of the polysilicon layer 14. N+impurities are then implanted near the surface of the polysilicon layer 14 at one selected contact window to form an N+region 17 which serves as a pick-up for the metal-silicide cathode. Metal, typically aluminum, is then deposited on the surface of the polysilicon layer 14 and defined by conventional techniques to form contacts at each contact window to create Schottky barrier anodes 18a, 18b, 18c and a contact 18d to the metal-silicide cathode.

Figure 4:
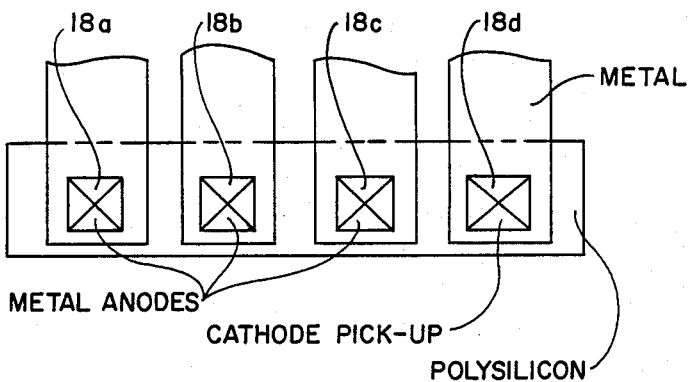
FIG. 4 is a topographical view of the completed Schottky diode island.

FIG. 4 shows a topographical view of a completed Schottky diode island.

We claim:

1. An integrated Schottky diode structure comprising:
   a first dielectric layer of electrically insulating material;
   a metal silicide layer disposed on the dielectric layer;

a polycrystalline silicon layer disposed on the metal silicide layer, a lower portion of the polycrystalline silicon layer being doped with N conductivity type impurity to provide an ohmic connection to the metal silicide layer;

a monocrystalline silicon layer disposed on the polycrystalline silicon layer, an upper portion of the monocrystalline silicon being doped with N conductivity type material to a lower concentration than the underlying polycrystalline silicon layer, at least one selected region of the monocrystalline silicon layer being doped with more N conductivity type impurity than the surrounding monocrystalline silicon layer;

a second dielectric layer of electrically insulating material disposed on the monocrystalline silicon layer, the second dielectric layer having a plurality of openings therein, each of said openings extending through the electrically insulating material to expose underlying monocrystalline silicon, at least one of the openings being aligned with the at least one selected region of the monocrystalline silicon layer having more N conductivity type impurity; and a plurality of metal connections to the monocrystalline silicon ohmically isolated from each other and positioned in the openings in the second dialectric layer to form anodes of the integrated diode structure, with the metal silicide layer forming a common cathode for all of the anodes.

2. Structure as in claim 1 wherein the metal silicide comprises tantalum silicide.

3. Structure as in claim 2 wherein each of the first and second dielectric layers comprises silicon dioxide.

* * * * *